United States Patent [19]

Kallman et al.

[11] Patent Number: 4,829,289
[45] Date of Patent: May 9, 1989

[54] STATIC GROUNDING AND MONITORING ACCESSORY

[75] Inventors: M. Raymond Kallman, Sea Cliff; Lawrence J. Mione, Brentwood; Peter Sabol, Huntington Station, all of N.Y.

[73] Assignee: Voltec Corporation, Plainview, N.Y.

[21] Appl. No.: 15,474

[22] Filed: Feb. 17, 1987

[51] Int. Cl.$^4$ ............................................. G08B 21/00
[52] U.S. Cl. ..................................... 340/656; 340/649; 324/508
[58] Field of Search ............... 340/635, 649, 650, 654, 340/656; 324/508, 509, 133; 361/42–50

[56] References Cited

U.S. PATENT DOCUMENTS

| | | | |
|---|---|---|---|
| 4,089,032 | 5/1978 | Dell Orfano | 340/656 |
| 4,118,690 | 10/1978 | Paynton | 340/656 |
| 4,484,185 | 11/1984 | Graves | 340/656 |
| 4,714,914 | 12/1987 | Boe | 340/573 |

Primary Examiner—Joseph A. Orsino
Assistant Examiner—Jeffery A. Hofsass
Attorney, Agent, or Firm—Nolte, Nolte & Hunter

[57] ABSTRACT

Electrical monitoring circuitry simultaneously and continuously tests a three-wire ground-type AC outlet for proper line voltage, polarity of the wiring and external ground resistance. The circuitry includes a single indicating lamp, preferably a light-emitting diode, which illuminates only when the proper conditions tested for exist at the outlet. For optimum convenience, the circuitry is incorporated in a male/female outlet adaptor which, in use, is plugged into the wall outlet to be tested, thereby to establish via the phase, neutral and ground prongs of the adaptor the necessary test connections of the circuitry to the wall outlet. The adaptor includes one or more jack receptacles internally connected to the adaptor ground prong for receiving static charges from external equipment and draining same to the building ground when the light-emitting diode illuminates.

6 Claims, 3 Drawing Sheets 4,829,289

STATIC GROUNDING AND MONITORING ACCESSORY

BACKGROUND OF THE INVENTION

This invention relates to electrical monitoring circuitry and devices for testing a three-wire ground-type AC outlet for line voltage, polarization and ground wire adequacy for draining static charges.

SUMMARY OF THE INVENTION

An object of the invention is to provide conveniently applied, reliable and operably safe means in which a single "go - no go" indicator indicates, simultaneously and continuously, whether or not a three-wire ground-type AC outlet is properly wired and, if so, whether or not static charges fed to the outlet ground wire will be adequately drained to the building ground.

Another object is to implement the aforesaid means with electrical circuitry disposed within a male/female outlet adaptor pluggable for use into a NEMA 5-15R or 5-20R outlet.

According to the invention, there is provided electrical monitoring circuitry for testing a three-wire ground-type AC outlet, the circuitry comprising first, second and third input terminals for connection to the outlet contacts assigned respectively to the phase, neutral and ground wires of a building mains system; a first conductor connected to the first input terminal; a second conductor connected to the second input terminal; a third conductor connected to the third input terminal; resistive means connected between the first and third conductors; voltage-responsive on-off switching means; and an indicating lamp serially connected with the switching means across the first and second conductors at a connection point to the first conductor beyond that of the resistive means; the switching means being arranged to switch on and cause illumination of the indicating lamp in response to a predetermined value of a portion of the voltage drop developed across the resistance provided by the resistive means in summation with the external ground resistance at the third input terminal when the input terminals are connected to the respective assigned outlet contacts and the latter are correctly wired to the building mains system.

Preferably, the third conductor is connected by way of high protective resistance to at least one jack provided for receiving static charges to be drained to ground from external equipment.

The circuitry may also include first, second and third output terminals connected to the first, second and third input terminals by way of the first, second and third conductors for supplying power to external equipment. In that case, it is preferred to connect the first, second and third input terminals respectively to phase, neutral and ground prongs of a male/female outlet adaptor, the corresponding prong-receiving openings of which are respectively connected to the first, second and third output terminals, the remaining portions of the circuitry being housed within the outlet adaptor, with the indicating lamp being exposed for viewing by way of a surface aperture in the adaptor.

These and other features of the invention will become more clearly evident from the ensuing detailed description when read in conjunction with the accompanying drawings.

DETAILED DESCRIPTION OF THE INVENTION

Figure 5:
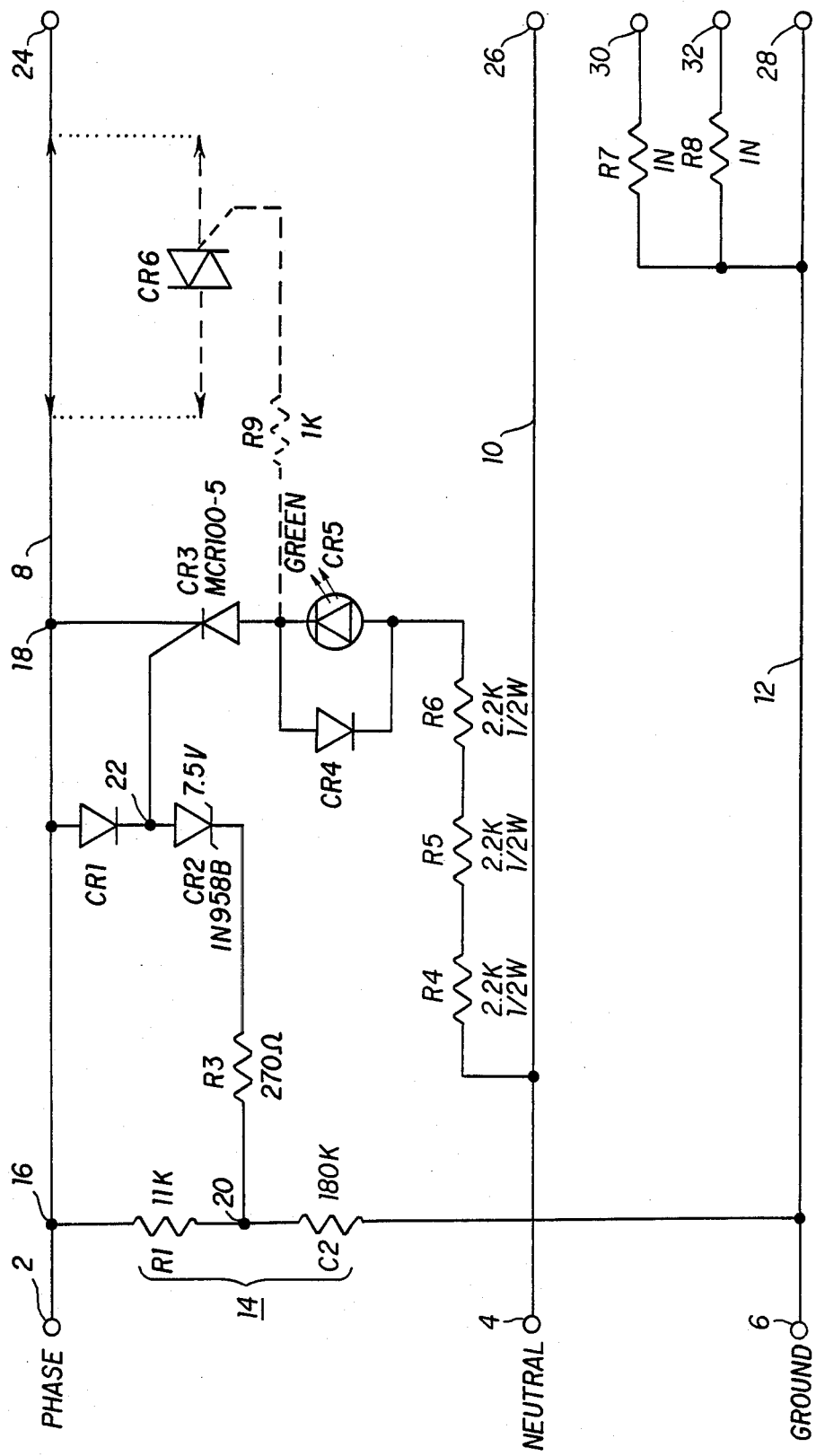
FIG. 5 is a schematic wiring diagram of electrical monitoring circuitry embodying the invention.

Referring first to the electrical monitoring circuitry schematically depicted in FIG. 5, there are shown a first input terminal 2, a second input terminal 4 and a third input terminal 6 for connection to wall outlet contacts (not shown) assigned respectively to the phase, neutral and ground wires of a building mains system. A first conductor 8 is connected to first input terminal 2, a second conductor 10 is connected to second input terminal 4 and a third conductor 12 is connected to third input terminal 6. Resistive means 14 consisting of a resistor R1 in series with a resistor R2 is connected between first conductor 8 and third conductor 12 at a connection point 16 to the first conductor. An indicating lamp, depicted as a green light emitting diode CR5, is serially connected with a voltage-responsive on-off switching means, depicted as an SCR switch CR3, across first conductor 8 and second conductor 10 at a connection point 18 to first conductor 8 beyond connection point 16 of resistive means 14. A series string of resistors R4, R5 and R6 is included in the series connection of SCR switch CR3 and light emitting diode CR5 and is electrically disposed between the light emitting diode and second conductor 10.

With the phase, neutral and ground wires of the mains correctly connected to the outlet contacts assigned thereto and with input terminals 2, 4 and 6 electrically connected to the corresponding outlet contacts, a voltage divider network is formed by the combination of the internal resistance path (resistors R1 and R2) and the external ground resistance RG, the latter existing between the outlet ground contact and the usual building ground connection near the mains transformer. The voltage developed across resistor R1 will then be dependent upon the line voltage supplied to the outlet and the value of external ground resistance RG.

Thus, for example, when resistor R1 is 11K ohms and resistor R2 is 180K ohms and when the line voltage is 105 VAC and external ground resistance RG is less than 15K ohms, the voltage developed across resistor R1 becomes sufficient to cause a Zener diode CR2 to conduct. It is seen in FIG. 5 that Zener diode CR2 has its cathode connected by way of a resistor R3 to a common terminal 20 of resistors R1 and R2, while its anode is connected to the cathode of a diode rectifier CR1 whose anode is connected to first conductor 8. A common terminal 22 of Zener diode CR2 and diode rectifier CR1 is connected to the gate electrode of SCR switch CR3.

When Zener diode CR2 conducts, it supplies gate current to SCR switch CR3 through resistor R3. This gate current causes SCR switch CR3 to switch on, permitting current flow through light emitting diode CR5 and resistors R4, R5 and R6. Resistor R3, for example, has a resistance of 270 ohms and serves to limit the gate current to SCR switch CR3 to safe levels. A diode rectifier CR4 is connected across light emitting diode CR5 in oppositely poled relation thereto for preventing excessive reverse voltage across the light emitting diode.

For every value of line voltage greater than 105 VAC, there exists a corresponding maximum value of external ground resistance RG greater than 15K ohms, below which value Zener diode CR2 will conduct. For example, for a line voltage of 115 VAC, Zener diode CR2 will conduct up to a value of external ground resistance RG of 34K ohms. The magnitude of the current through light emitting diode CR5, and consequently its brightness, is increased by increasing the line voltage, as well as by decreasing the value of external ground resistance RG.

Conductors 8, 10 and 12 extend, respectively, from phase, neutral and ground input terminals 2, 4 and 6 to phase, neutral and ground output terminals 24, 26 and 28 from which power supplied to the electrical monitoring circuitry from the mains may be delivered to any external utilization device or equipment requiring same.

Static charge receiving terminals 30 and 32 are connected, respectively, via protective resistors R7 and R8 to conductor 12 for draining static charges received from external equipment to the building ground. Each resistor R7 and R8 has a high resistance of, for example, 1M ohms to safeguard personnel from shock hazard.

Should it be desired also to control power delivered by the electrical monitoring circuitry depicted in FIG. 5, the circuitry may be modified to incorporate a TRIAC (bidirectional triode thyristor) CR6 in phase conductor 8 between terminals 18 and 24, as shown by phantom outline in FIG. 5. In particular, SCR switch CR3 is arranged to control gate current fed to TRIAC CR6 by way of a connection to the gate electrode of the TRIAC from the anode of the SCR switch, such connection including a resistor R9 of, for example, 1K ohms. By this arrangement, TRIAC CR6 will be switched on and off with the illumination and extinguishment, respectively, of light emitting diode CR5, thereby controlling power to be delivered by way of the circuitry.

Referring now to FIGS. 1–4, various views are shown of a male/female outlet adaptor 34 configured to house the electrical monitoring circuitry of FIG. 5 and to be plugged at its male end into standard 120 VAC outlets of the NEMA 5-15R (15 Amp) or NEMA 5-20R (20 Amp) type. Its own outlet 36 is of the NEMA 5-15R type, as seen in the FIG. 1 female end view of adaptor 34.

Figure 1:
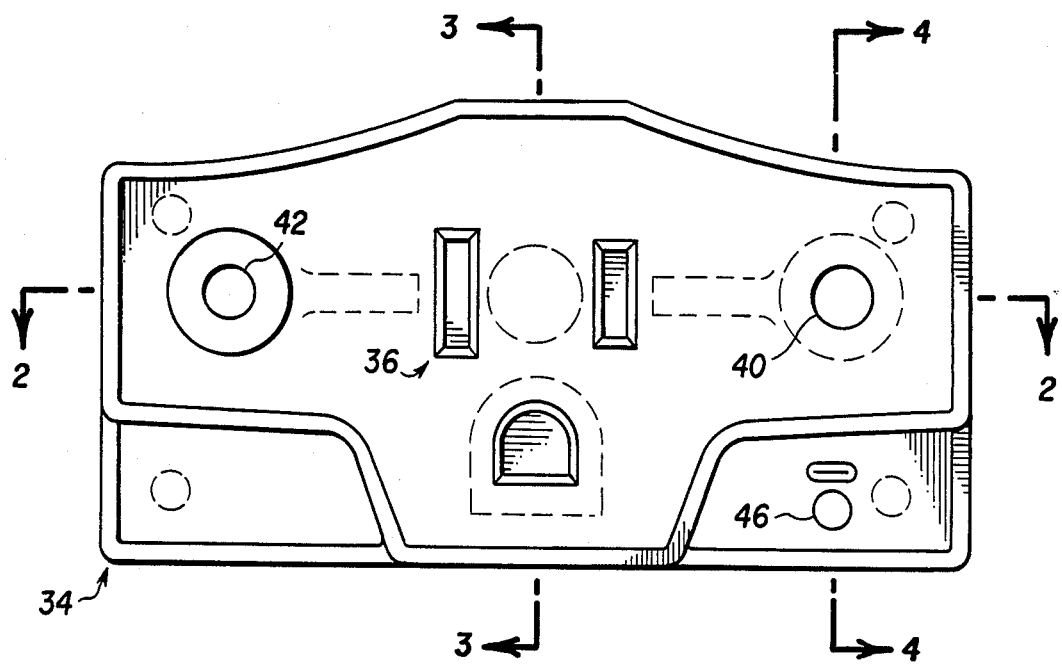
FIG. 1 is a view in elevation of the female end of a male/female outlet adaptor for a three-wire ground-type AC outlet, the adaptor being configured to house electrical monitoring circuitry embodying the invention.
Figure 2:
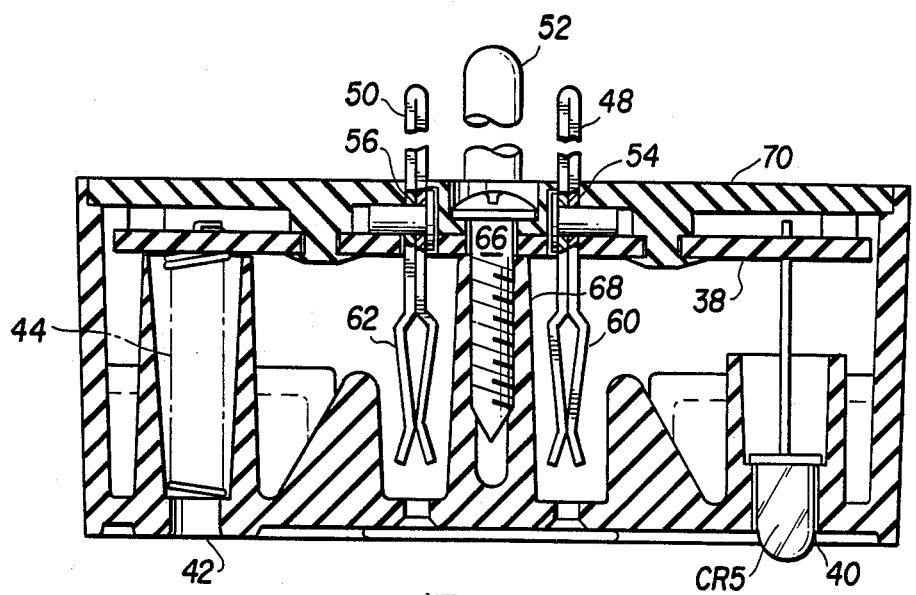
FIG. 2 is a sectional view of the outlet adaptor taken along the line 2—2 of FIG. 1.
Figure 3:
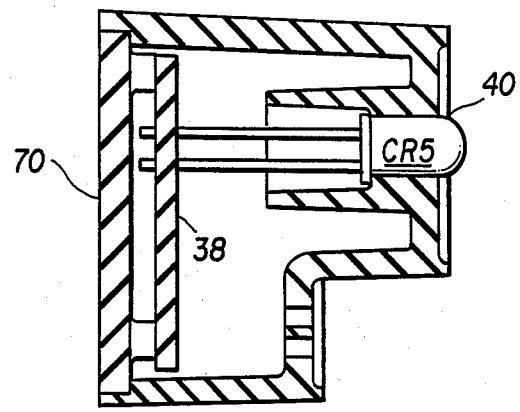
FIGS. 3 and 4 are sectional views of the outlet adaptor taken along the lines 3—3 and 4—4, respectively, of FIG. 1.
Figure 4:
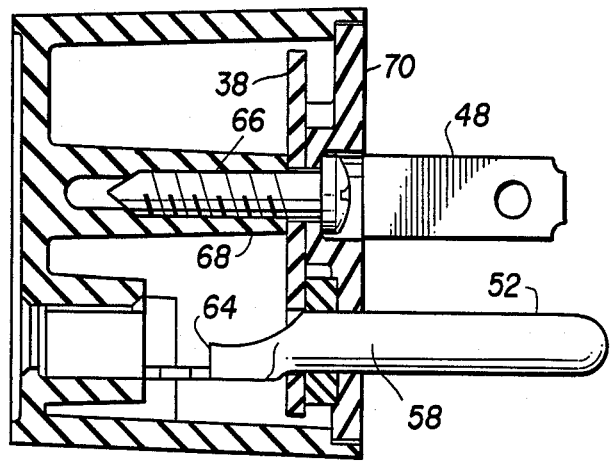

FIGS. 2–4 include a representation of a printed circuit board 38 which, on respective sides thereof, carries the wiring and the components of the circuitry of FIG. 5. The electrical connection of light-emitting diode CR5 to circuit board 38 is shown in FIGS. 2 and 3 which also show a surface aperture 40 of the adaptor 34 through which light-emitting diode CR5 is exposed for viewing. Another surface aperture 42 is provided through which a banana jack (not shown) may be plugged into adaptor 34 and thereby come into resilient wrap-around electrical contact with a helically-wound spring 44 connected by way of circuit board 38 to terminal 30 of ground conductor 12 (FIG. 5). Yet another surface aperture 46 is provided for receiving a simple wire jack (not shown) to establish a connection by way of circuit board 38 to terminal 32 of ground conductor 12. Each such jack connection accordingly effects the draining of static charges to ground from remotely located equipments electrically associated with the jacks.

Phase prong 48, neutral prong 50 and ground prong 52 of adaptor 34 have inwardly extending portions 54, 56 and 58 electrically connected, respectively, to the monitoring circuit input terminals 2, 4 and 6 and output terminals 24, 26 and 28 (FIG. 5) as they pass through circuit board 38, these portions terminating internally of adaptor 34 at a phase contact 60, neutral contact 62 and ground contact 64 of adaptor outlet 36. Access to the interior of adaptor 34 is achieved by unscrewing a thread-forming screw 66 from a receiving post 68, thereby releasing a cover plate 70 for removal from the male end of adaptor 34.

When plugged into a wall outlet to be tested, adaptor 34 monitors, simultaneously and continuously, the line voltage, polarity of the wiring and the ground resistance of the wall outlet. If the line voltage is greater than a predetermined value, the wall outlet is properly wired and the external ground resistance is below a predetermined value, light emitting diode CR5 will illuminate. On the other hand, the following miswirings at the wall outlet will prevent light emitting diode CR5 from illuminating:

(a) no connection of phase wire of mains system (no mains voltage to power the LED)
(b) no connection of neutral wires of mains system (no return path for the LED current)
(c) no connection of ground wire of mains system (no voltage developed across voltage divider resistor R1)
(d) reversed phase and neutral wires of mains system (LED off for all neutral to ground voltages less than 105 VAC)
(e) reversed phase and ground wires of mains system (resistor string R4–R6 prevents perceptible illumination of LED for neutral to ground voltages less than 10 VAC).

Adaptor 34 does not waste the wall outlet into which it is plugged, as its own outlet 36 supplies the same mains power. Nor does adaptor 34 obstruct the adjacent wall outlet when plugged into a duplex receptacle, as it has a low profile. It is moreover extremely rugged and can be operationally installed without tools.

What is claimed is:

1. Electrical monitoring circuitry for testing the wiring of a three-wire ground-type AC outlet, said circuitry comprising first, second and third input terminal means for connection to the outlet contacts assigned, respectively, to the phase, neutral and ground wires of a building mains system; a first conductor connected to said first input terminal mean; a second conductor connected to said second input terminal means; a third conductor connected to said third input terminal means; resistive means connected between said first and third conductors for developing a voltage drop between the phase and ground wires; voltage-responsive on-off switching means for responding to a voltage drop; and an indicating lamp serially connected with said on-off switching means across said first and second conductors at a connection point to said first conductor beyond that of said resistive means, said on-off switching means being arranged for switching on and illuminating said indicating lamp in response to a predetermined value of a portion of the voltage drop developed across the resistance provided by said resistive means in summation with the external ground resistance at said third input terminal only when said input terminals are connected to said respective assigned outlet contacts and the latter are correctly wired to said building means system.

2. Electrical monitoring circuitry according to claim 1, wherein said resistive means comprises a voltage divider, the dividing point of which is connected in controlling relation to a Zener diode for causing said Zener diode to conduct and supply gate current when said predetermined value exists of said voltage drop portion; and wherein said switching means comprises an SCR switch, the gate electrode of which is connected to said Zener diode to receive said gate current.

3. Electrical monitoring circuitry according to claim 1, wherein said third conductor is connected by way of high protective resistance to at least one jack said jack constituting means for receiving static charges to be drained to ground from external equipment.

4. Electrical monitoring circuitry according to claim 1, comprising first, second and third output terminals connected to said first, second and third input terminals by way of said first, second and third conductors for supplying power to external equipment.

5. Electrical monitoring circuitry according to claim 4, wherein second switching means are disposed in one of said first and second conductors and are arranged to switch on in response to the flow of illuminating current through said indicating lamp, thereby to control the delivery of power to said first and second output terminals.

6. Electrical monitoring circuitry according to claim 4, wherein said first, second and third input terminals are respectively connected to phase, neutral and ground prongs of a male/female outlet adaptor, the phase, neutral and ground prong-receiving contacts of which are respectively connected to said first, second and third output terminals; and wherein the remaining portions of said circuitry are housed within said outlet adaptor, said indicating lamp being exposed for viewing by way of a surface aperture in said adaptor.

* * * * *